(12) United States Patent
Chang-Chien et al.

(10) Patent No.: US 7,696,062 B2
(45) Date of Patent: Apr. 13, 2010

(54) METHOD OF BATCH INTEGRATION OF LOW DIELECTRIC SUBSTRATES WITH MMICS

(75) Inventors: Patty Pei-Ling Chang-Chien, Redondo Beach, CA (US); Chi Kong Cheung, Pasadena, CA (US); Melanie Sachiko Yajima, Los Angeles, CA (US); Xianglin Zeng, Monterey Park, CA (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 356 days.

(21) Appl. No.: 11/828,147

(22) Filed: Jul. 25, 2007

(65) Prior Publication Data

US 2009/0029554 A1 Jan. 29, 2009

(51) Int. Cl.
*H01L 21/30* (2006.01)
(52) U.S. Cl. .................... 438/455; 438/456; 438/464
(58) Field of Classification Search .............. 438/107, 438/109, 118, 121, 125, 455, 456, 464
See application file for complete search history.

(56) References Cited

U.S. PATENT DOCUMENTS

| | | | |
|---|---|---|---|
| 4,442,590 A | 4/1984 | Stockton et al. | |
| 5,023,624 A | 6/1991 | Heckaman et al. | |
| 5,132,648 A | 7/1992 | Trinh et al. | |
| 5,219,377 A | 6/1993 | Poradish | |
| 5,527,744 A | 6/1996 | Mignardi et al. | |
| 5,566,441 A | 10/1996 | Marsh et al. | |
| 5,826,328 A | 10/1998 | Brady et al. | |
| 5,859,614 A | 1/1999 | Paolella et al. | |
| 6,243,040 B1 | 6/2001 | Corey et al. | |
| 6,306,685 B1* | 10/2001 | Liu et al. | 438/121 |
| 6,451,627 B1* | 9/2002 | Coffman | 438/111 |
| 6,596,635 B1 | 7/2003 | Tiku et al. | |
| 6,614,117 B1 | 9/2003 | Tiku et al. | |
| 6,702,185 B1 | 3/2004 | Zercher | |
| 6,812,078 B2 | 11/2004 | Borghs et al. | |
| 6,848,162 B2 | 2/2005 | Arneson et al. | |
| 6,900,072 B2 | 5/2005 | Patel et al. | |
| 7,067,397 B1 | 6/2006 | Chang-Chien et al. | |
| 2004/0152276 A1 | 8/2004 | Nishimura | |
| 2004/0219764 A1* | 11/2004 | Syllaios et al. | 438/456 |
| 2004/0262722 A1 | 12/2004 | Sekiguchi | |
| 2005/0161753 A1 | 7/2005 | Huff et al. | |
| 2006/0010685 A1 | 1/2006 | Kobayashi et al. | |
| 2006/0238989 A1 | 10/2006 | Manes et al. | |
| 2006/0276157 A1 | 12/2006 | Chen et al. | |
| 2008/0048313 A1* | 2/2008 | Sand | 438/106 |

* cited by examiner

*Primary Examiner*—Kevin M Picardat
(74) *Attorney, Agent, or Firm*—John A. Miller; Miller IP Group, PLC

(57) ABSTRACT

A method for mounting a dielectric substrate to a semiconductor substrate, such as mounting a dielectric antenna substrate to an MMIC semiconductor substrate. The method includes providing a thin dielectric antenna substrate having metallized layers on opposing sides. In one embodiment, carrier wafers are used to handle and maintain the dielectric substrate in a flat configuration as the metallized layers are patterned. The dielectric substrate is sealed to the semiconductor substrate using a low temperature bonding process. In an alternate embodiment, the metallized layers on the dielectric substrate are patterned simultaneously so as to prevent the substrate from curling.

20 Claims, 4 Drawing Sheets

US 7,696,062 B2

METHOD OF BATCH INTEGRATION OF LOW DIELECTRIC SUBSTRATES WITH MMICS

GOVERNMENT CONTRACT

The U.S. Government may have a paid-up license in this invention and the right in limited circumstances to require the patent owner to license others on reasonable terms as provided for by the terms of Contract No. FA8650-06-C-7600 awarded by the United States Air Force.

BACKGROUND OF THE INVENTION

1. Field of the Invention

This invention relates generally to a method for attaching a dielectric substrate to a semiconductor substrate and, more particularly, to a method for attaching a dielectric antenna substrate to a monolithic millimeter-wave integrated circuit (MMIC) substrate using carrier wafers or other processes for maintaining the antenna substrate substantially flat.

2. Discussion of the Related Art

Transceiver modules are known in the art that include an array of antennas each separately mounted to an antenna substrate and coupled to a transceiver front end including a plurality of antenna channels. Typically, the various amplifiers, filters, phase shifters, mixers, analog-to-digital converters, switches, etc. that are part of the front end of the transceiver module are separately fabricated as integrated circuits onto several semiconductor wafers, and then later assembled into the transceiver module using well known semiconductor assembly techniques.

It is typically difficult to mount a dielectric antenna substrate to a semiconductor substrate because the antenna substrate is made of a dielectric material and can be very thin for high frequency applications. Particularly, because the antenna substrate can be very thin and its usually flexible, it tends to curl when metal layers on both side of the substrate are patterned into the antenna patches and electrical connections.

U.S. Pat. No. 7,067,397, titled Method of Fabricating High Yield Wafer Level Packages Integrating MMIC and MEMS Components, issued Jun. 27, 2006, to Chang-Chien et al., assigned to the Assignee of this application and herein incorporated by reference, discloses a low temperature bonding process for bonding two semiconductor wafers to each other in a wafer-level packaging process.

FIG. 1 is a cross-sectional view of a wafer-level package 10 of the type disclosed in the '397 patent. The package 10 includes a semiconductor substrate wafer 12, such as an InP, GaAs, silicon, etc., and a semiconductor cover wafer 14 bonded to the substrate wafer 12 by a bonding ring 16. The bonding ring 16 defines a hermetically sealed cavity 18 in which an integrated circuit 20 fabricated on the substrate wafer 12 is sealed when the cover wafer 14 is bonded to the substrate wafer 12. The '397 patent discloses a process for sealing the cover wafer 14 to the substrate wafer 12 by bonding separate bonding rings together using a low-temperature process.

SUMMARY OF THE INVENTION

In accordance with the teachings of the present invention, a method for mounting a dielectric substrate to a semiconductor substrate is disclosed. In one non-limiting embodiment, the dielectric substrate is an antenna substrate and the semiconductor substrate is an MMIC substrate. The method includes providing a thin dielectric antenna substrate including metallized layers on opposing sides. In one non-limiting embodiment, carrier wafers are used to handle and maintain the antenna substrate in a flat configuration as the metallized layers are patterned. A carrier wafer is also used to transfer the dielectric substrate to the semiconductor substrate. The dielectric substrate is attached to the semiconductor substrate using a low temperature bonding process. In an alternate embodiment, the metallized layers on the dielectric substrate are patterned simultaneously so as to prevent the substrate from curling, which eliminates the need for the carrier wafers.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a method for mounting a dielectric substrate to a semiconductor substrate is merely exemplary in nature, and is in no way intended to limit the invention or its applications or uses. For example, the discussion below describes mounting a dielectric antenna substrate to a stack of MMIC wafers in a transceiver array module. However, it will be appreciated by those skilled in the art that the method for mounting a dielectric substrate to a semiconductor substrate will have application for other devices.

As will be discussed below, the present invention proposes a process for mounting a dielectric substrate to a semiconductor substrate, and has a particular non-limiting application for mounting a dielectric antenna substrate to an MMIC substrate for each channel of a transceiver array. The present invention eliminates or minimizes the antenna sub-assembly processes, and can provide batch integration of antenna substrates and MMICs, which are done in parallel at the wafer level by wafer bonding. Because antenna substrates are typically very thin and are made of a dielectric material, it is difficult to attach the antenna substrate to the MMIC substrate in an integrated manner to reduce the size and cost of fabricating the system. The process of the invention allows a direct low loss contact for direct feed antenna configurations for very close proximity attachments for electro-magnetic coupling of antenna configurations. Further, the invention allows direct integration of MMICs to reduce losses from interconnections. The present invention can be provided for common antenna substrates that are commercially available, and can accommodate pre-fabricated antenna substrates.

Figure 2:
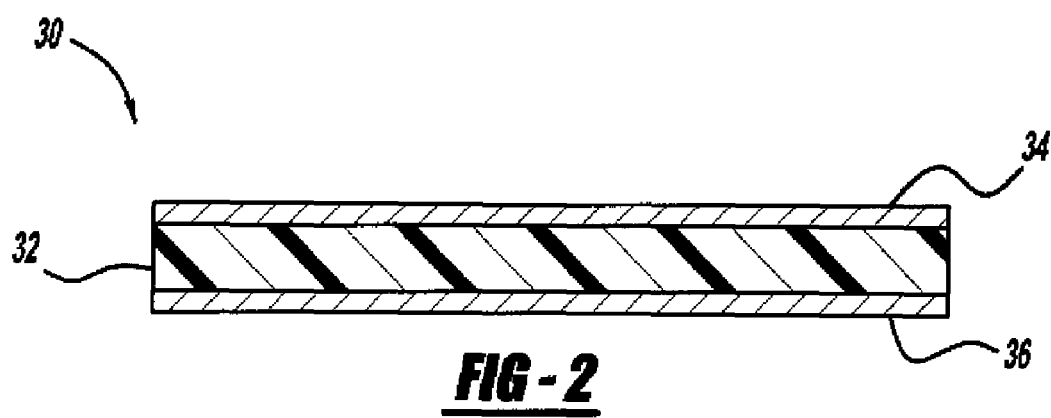
FIG. 2 is a cross-sectional view of an antenna substrate.

FIG. 2 is a cross-sectional view of a commercially available antenna substrate 30 including a dielectric layer 32, a top copper layer 34 and a bottom copper layer 36. In one non-limiting embodiment, the antenna substrate 30 can have a thickness as thin as tens of microns or a few hundred microns or less, and includes a suitable dielectric material, such as the commercially available Duroid 5880. However, the antenna substrate 30 can be made of other dielectric materials, such as Rexalite, and can also be an assembly of layers formed as a laminate. Other antenna substrate thicknesses are also available commercially. The copper layers 34 and 36 will be patterned using a suitable photoresist and etching process to define a patch antenna, bonding metal and signal and ground traces.

Figure 3:
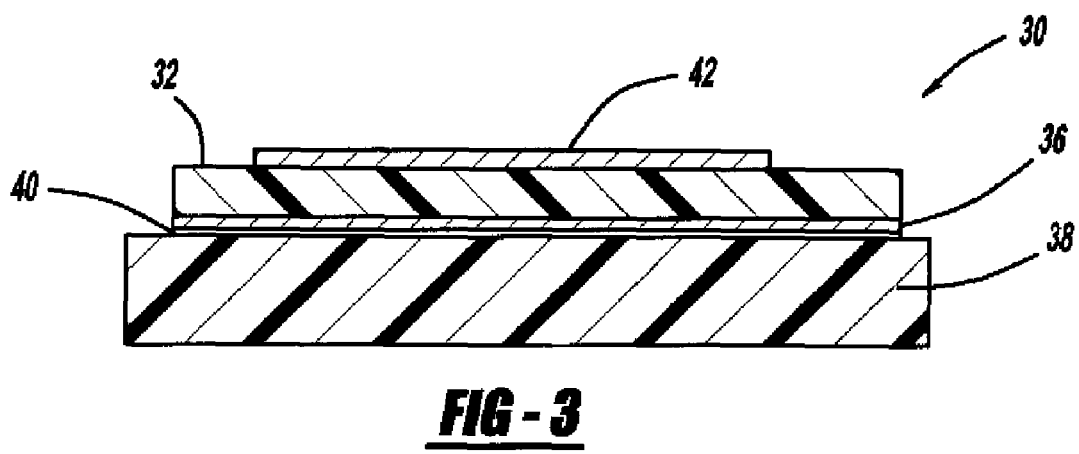
FIG. 3 is a cross-sectional view of a dielectric antenna substrate shown in FIG. 2 mounted to a first carrier wafer, and including a patterned antenna on one surface.

FIG. 3 is a cross-sectional view of the antenna substrate 30 attached to a first carrier wafer 38 by a low temperature thermal release tape 40. Other attachment methods can also be used to attach the antenna substrate 30 to a carrier wafer including using wax or polymer based bonding agents. The carrier wafer 38 can be made of any suitable material, such as silicon, sapphire, glass or III-V compound semiconductor substrates, and can have any suitable thickness, such as 20 mils. The copper layer 34 has been patterned by a suitable patterning process using a photoresist to define a patch antenna 42.

Figure 4:
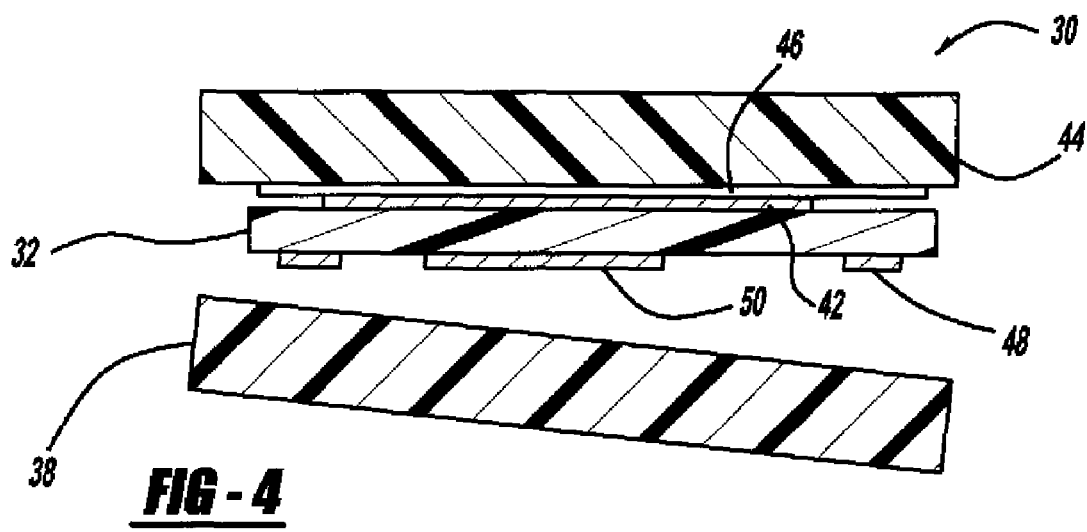
FIG. 4 is a cross-sectional view of the antenna substrate shown in FIG. 3 including a carrier wafer mounted to an opposite side of the antenna substrate.

Once the copper layer 34 has been patterned to define the antenna 42, a second carrier wafer 44, shown in FIG. 4, is attached to an opposite surface of the antenna substrate 30 from the carrier wafer 38 using a low temperature thermal release tape 46 or other suitable attachment methods. The first carrier wafer 38 is then removed by heating the release tape 40 or by releasing the bonding agents, and the copper layer 36 is patterned using a photoresist process to form a wafer-level packaging bonding ring 48 and signal and/or ground traces 50. By using the carrier wafer 44, dicing and separation of individual elements, including the antenna 42, from the wafer can be provided without damaging the fragile and thin antenna substrates. The carrier wafer 38 is shown being attached to the antenna substrate 34 for a single antenna. In a practical fabrication process, a single carrier wafer will be used to handle an antenna substrate from which many antennas will be patterned in a batch integration processes.

Figure 5:
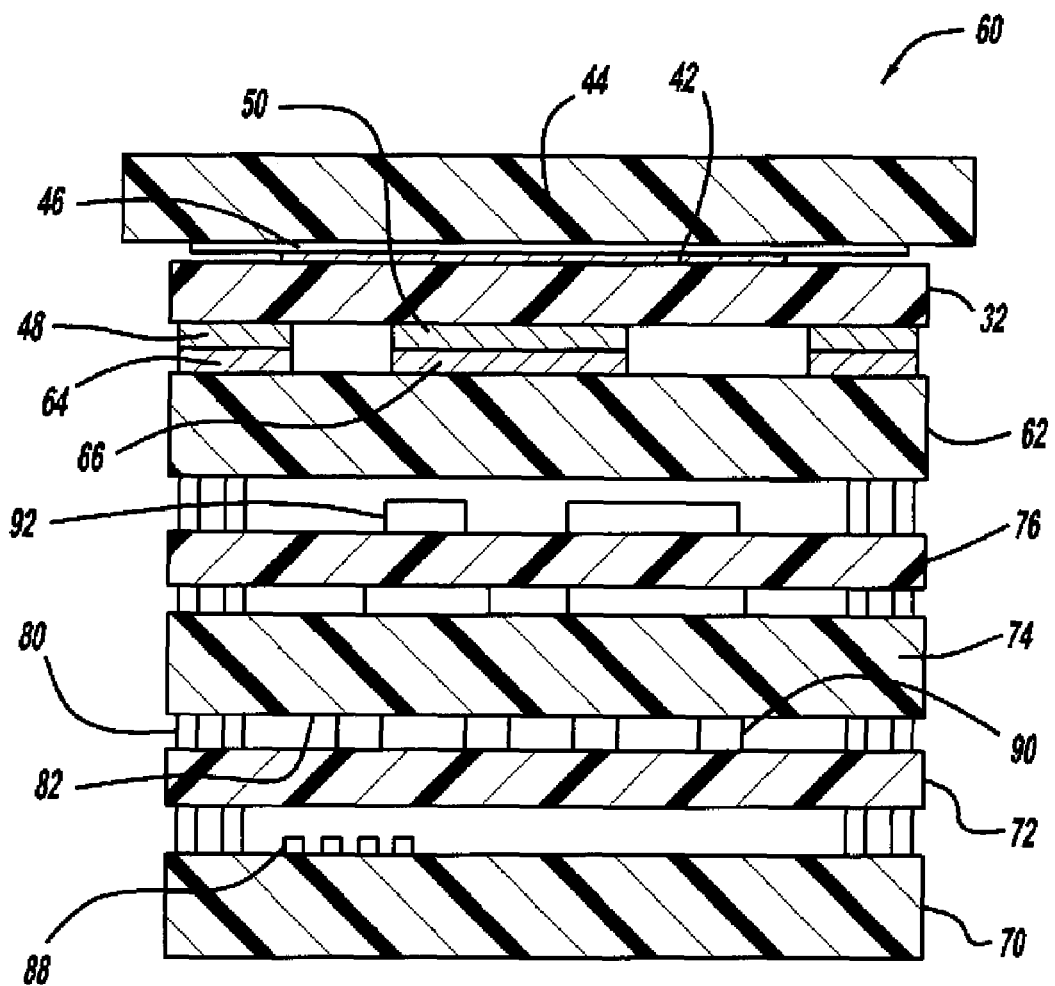
FIG. 5 is a cross-sectional view of the antenna substrate mounted to a plurality of MMIC wafers in a transceiver array, according to an embodiment of the present invention.

FIG. 5 is a cross-sectional view of a transceiver module 60 including the patterned antenna substrate 30. The antenna substrate 30 is mounted to a semiconductor wafer 62, such as an MMIC wafer, while the carrier wafer 44 is still bonded thereto, and the carrier wafer 44 is thereafter removed. Particularly, the bonding ring 48 is bonded to a bonding ring 64 formed on a top surface of the wafer 62, and the trace 50 is bonded to a trace 66 on the top surface of the wafer 62 to provide signal connection, as shown. According to the invention, the low-temperature bonding process that is used to bond the semiconductor wafers 12 and 14 together can be used to bond a semiconductor wafer and a dielectric wafer, particularly the substrate 30 and the wafer 62. Other suitable wafer bonding processes can also be used for this purpose.

Figure 1:
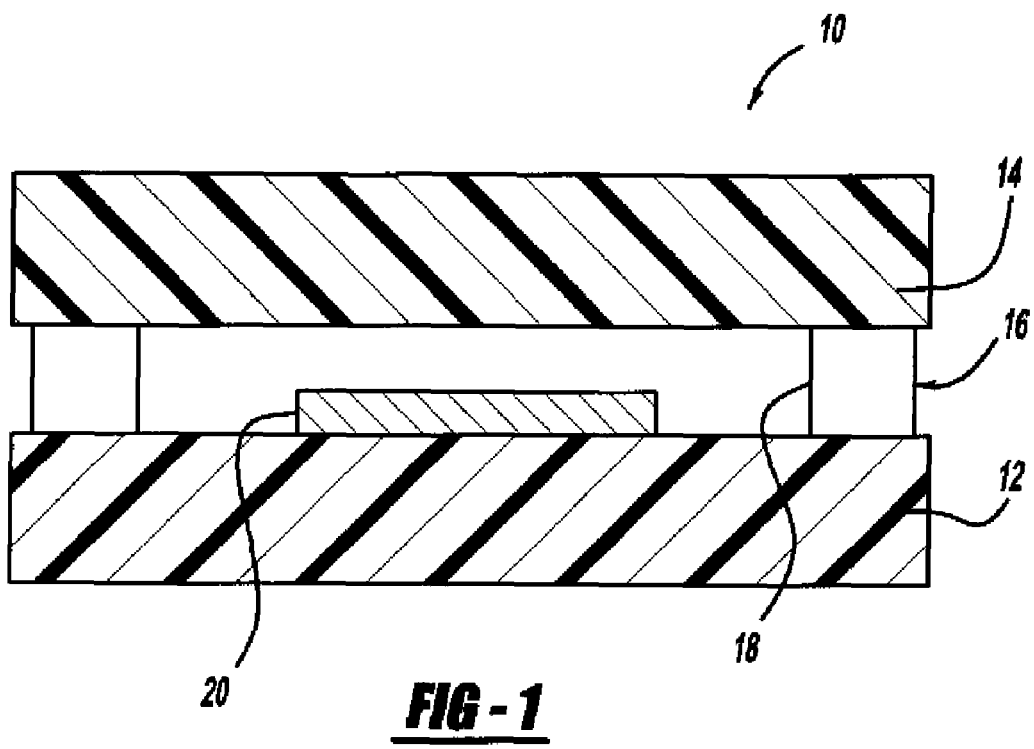
FIG. 1 is a cross-sectional view of a wafer-level package showing two semiconductor wafers attached together by a bonding ring.

The bonding ring 64 will include the required bonding layers, as discussed above with reference to FIG. 1. In one non-limiting embodiment, the wafer 62 is a group III-V semiconductor wafer acting as an interposer, and is about 4 μm thick, but can have any suitable thickness.

The semiconductor wafer 62 is part of a semiconductor wafer assembly including wafer-level packages provided by stacked wafers including a substrate wafer 70, a first intermediate semiconductor wafer 72, a second intermediate semiconductor wafer 74 and a third intermediate semiconductor wafer 76. More or fewer wafers can be provided in other embodiments. In this non-limiting embodiment, the wafers 62, 70, 72, 74 and 76 are mounted together using bonding rings 80 that define wafer-level packaging and hermetically sealed cavities 82 in which the various circuit components for the transceiver module 60 are fabricated by the bonding process discussed above. For example, the substrate wafer 70 may include RF distribution and control circuits 88, the wafer 72 may include phase shifters 90, the wafer 74 may include gain and power amplifiers 92, etc.

In an alternate embodiment, the carrier wafers 38 and 44 are not used to handle the dielectric antenna substrate 30. The carrier wafers 38 and 44 are mounted to the antenna substrate 30 to prevent it from curling as copper is removed from the patterning process on the substrate 30. In the alternate embodiment, the copper layers 34 and 36 are patterned simultaneously to prevent the antenna substrate 30 from curling.

Figure 6:
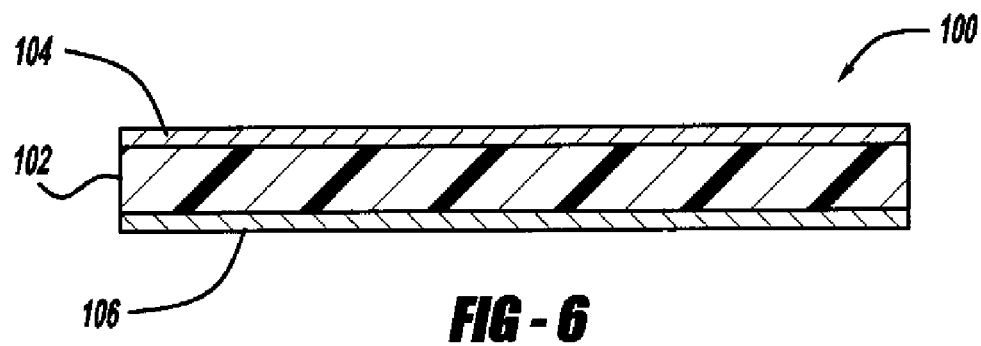
FIG. 6 is a cross-sectional view of another dielectric antenna substrate.

FIGS. 6-10 show this embodiment of the invention. Particularly, FIG. 6 shows a thin dielectric antenna substrate 100 including a dielectric layer 102 and opposing copper layers 104 and 106, and is similar to the antenna substrate 30.

Figure 7:
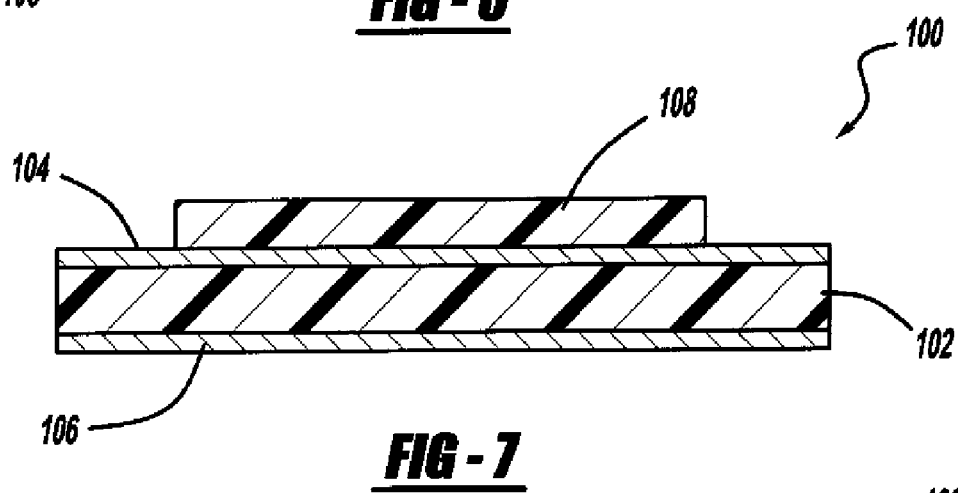
FIG. 7 is a cross-sectional view of the antenna substrate shown in FIG. 6 including a patterned photoresist on one side.
Figure 8:
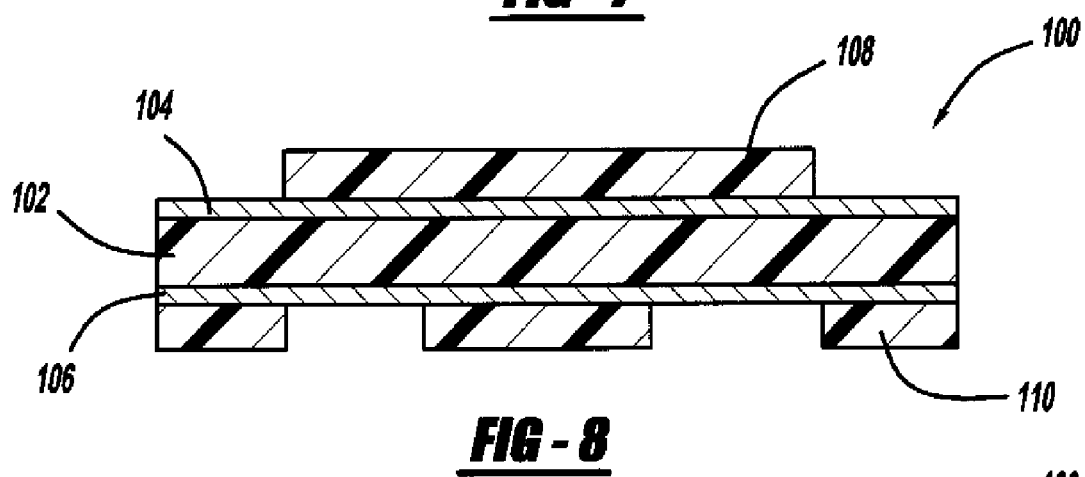
FIG. 8 is a cross-sectional view of the antenna substrate shown in FIG. 7 including a patterned photoresist layer on an opposite side.
Figure 9:
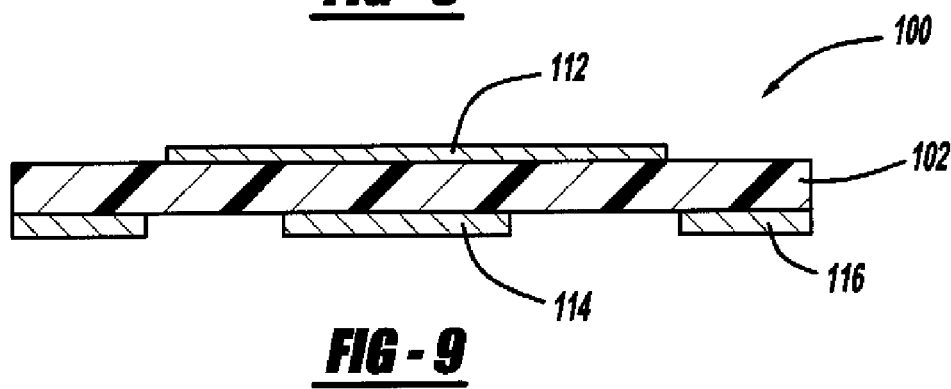
FIG. 9 is a cross-sectional view of the antenna substrate shown in FIG. 6 where metallized layers have been patterned using the photoresist layers.

In FIG. 7, a photoresist layer 108 is deposited on the copper layer 104 and patterned to define the antenna. Before the antenna is formed, a photoresist layer 110 is deposited on the copper layer 106 and patterned as shown in FIG. 8 to define the signal traces and the bonding ring. FIG. 9 shows the antenna substrate 100 after the copper layers have been etched to define a patch antenna 112, signal and/or ground traces 114 and a bonding ring 116, which is the same as the antenna substrate 30 shown in FIG. 4. Thus, by merely using a wafer-handling fixture (not shown), well known to those skilled in the art, the antenna substrate 100 can be patterned in this manner where the dielectric layer 102 will not curl as a result of copper being removed from one of the surfaces.

Figure 10:
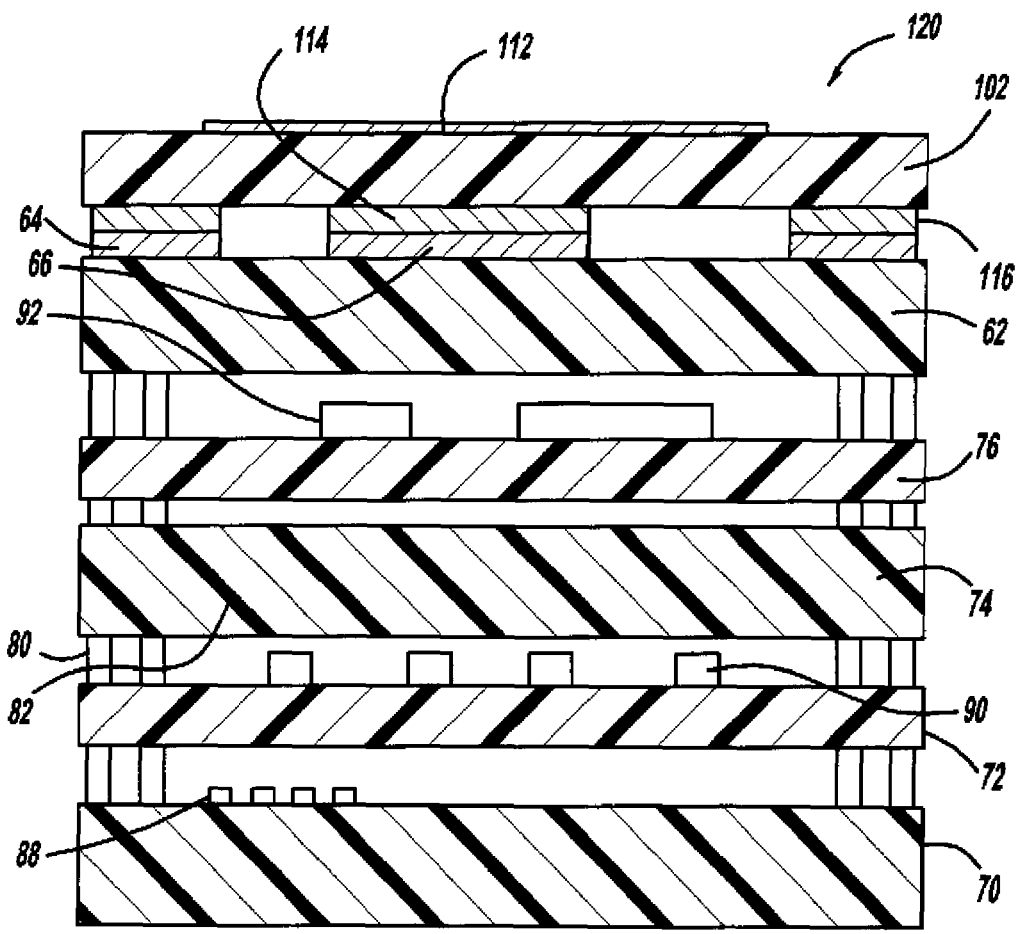
FIG. 10 is a cross-sectional view of the antenna substrate mounted to a plurality of MMIC wafers in a transceiver array, according to another embodiment of the present invention.

FIG. 10 is a cross-sectional view of a transceiver module 120 similar to the transceiver module 60, where like elements are identified by the same reference numeral. In this embodiment, the antenna substrate 100 is mounted to the semiconductor wafer 62 without the need of the carrier wafer 44. The antenna substrate 100 is bonded to the semiconductor wafer 62 in the same manner using the low-temperature bonding process or other suitable wafer bonding processes.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A method for mounting a dielectric substrate to at least one semiconductor substrate, said method comprising:
   providing a dielectric substrate including a dielectric layer and first and second metallized layers on opposite sides of the dielectric layer;
   attaching a first carrier wafer to the second metallized layer;

patterning the first metallized layer;
attaching a second carrier wafer to the patterned first metallized layer;
removing the first carrier wafer;
patterning the second metallized layer to include a first bonding ring;
bonding the dielectric substrate to at least one semiconductor substrate by bonding the first bonding ring to a second bonding ring formed on a surface of the semiconductor substrate; and
removing the second carrier wafer from the dielectric substrate.

2. The method according to claim 1 wherein bonding the dielectric substrate to the semiconductor substrate includes heating an indium layer formed on a gold layer on the second bonding ring attached to the semiconductor wafer and pressing the first bonding ring to the second bonding ring.

3. The method according to claim 1 wherein the dielectric substrate is an antenna substrate and the first metallized layer is patterned into an antenna.

4. The method according to claim 1 wherein the first and second carrier wafers are mounted to the metallized layer by a thermal release tape.

5. The method according to claim 1 wherein the at least one semiconductor wafer is a plurality of semiconductor wafers bonded together to provide hermetically sealed cavities therebetween.

6. The method according to claim 5 wherein the plurality of semiconductor wafers define a transceiver module.

7. The method according to claim 1 wherein the dielectric substrate has a thickness of 100 μm or less.

8. The method according to claim 1 wherein the semiconductor wafer is a GaAs or InP semiconductor wafer.

9. A method for mounting a dielectric substrate to at least one semiconductor wafer, said method comprising:
providing a dielectric substrate including a dielectric layer and first and Second metalized layers on opposite sides of the dielectric layer;
depositing and patterning a first photoresist layer on the first metallized layer;
depositing and patterning a second photoresist layer on the second metallized layer;
simultaneously using the first and second photoresist layers to pattern the first and second metallized layers so that the second metallized layer includes a first bonding ring; and
bonding the dielectric substrate to the at least one semiconductor substrate by bonding the first bonding ring to a second bonding ring formed on a surface of the semiconductor substrate.

10. The method according to claim 9 wherein bonding the dielectric substrate to the semiconductor substrate includes heating an indium, layer formed on a gold layer on the second bonding ring attached to the semiconductor wafer and pressing the first bonding ring to the second bonding ring.

11. The method according to claim 9 wherein the dielectric substrate is an antenna substrate and the first metallized layer is patterned into an antenna.

12. The method according to claim 9 wherein the at least one semiconductor wafer is a plurality of semiconductor wafers bonded together to provide hermetically sealed cavities therebetween.

13. The method according to claim 12 wherein the plurality of semiconductor wafers define a transceiver module.

14. The method according to claim 9 wherein the dielectric substrate has a thickness of 100 μm or less.

15. The method according to claim 9 wherein the semiconductor wafer is a GaAs or InP semiconductor wafer.

16. A method for mounting a dielectric substrate to at least one semiconductor substrate, said method comprising:
providing a dielectric substrate that includes a first bonding ring, said first bonding ring including a gold layer;
providing a semiconductor substrate that includes a second bonding ring, said second bonding ring including a gold layer and an indium layer;
positioning the dielectric substrate relative to the semiconductor substrate so the first bonding ring and second bonding ring are positioned against each other; and
heating the first and second bonding ring to melt the indium and bond the first bonding ring to the second bonding ring so as provide a sealed cavity between the dielectric substrate and the semiconductor substrate.

17. The method according to claim 16 wherein the dielectric substrate has a thickness of 100 μm or less.

18. The method according to claim 16 wherein the dielectric substrate is an antenna substrate.

19. The method according to claim 16 wherein the semiconductor wafer is a GaAs or InP semiconductor wafer.

20. The method according to claim 16 wherein bonding the first and second bonding rings includes using a low-temperature bonding process.

* * * * *